United States Patent
Ren et al.

(10) Patent No.: US 7,589,658 B2
(45) Date of Patent: Sep. 15, 2009

(54) ANALOG-TO-DIGITAL CONVERTER WITH VARIABLE GAIN AND METHOD THEREOF

(75) Inventors: Juxiang Ren, Austin, TX (US); Mike R. Garrard, Chelmsford (GB); Robert S. Jones, III, Austin, TX (US); Douglas A. Garrity, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/026,205

(22) Filed: Feb. 5, 2008

(65) Prior Publication Data

US 2009/0195428 A1 Aug. 6, 2009

(51) Int. Cl.
*H03M 1/38* (2006.01)

(52) U.S. Cl. .................................. 341/161; 341/155

(58) Field of Classification Search .................. 341/155, 341/172, 122, 163, 161
See application file for complete search history.

(56) References Cited

U.S. PATENT DOCUMENTS

| | | | |
|---|---|---|---|
| 4,710,724 A | 12/1987 | Connell et al. | |
| 5,574,457 A | 11/1996 | Garrity et al. | |
| 5,625,361 A | 4/1997 | Garrity et al. | |
| 5,644,313 A * | 7/1997 | Rakers et al. | 341/163 |
| 5,680,070 A | 10/1997 | Anderson et al. | |
| 5,710,563 A | 1/1998 | Vu et al. | |
| 6,195,032 B1 | 2/2001 | Watson et al. | |
| 6,362,770 B1 | 3/2002 | Miller et al. | |
| 6,420,991 B1 | 7/2002 | Yu | |
| 6,489,914 B1 * | 12/2002 | Jones et al. | 341/162 |
| 6,535,157 B1 * | 3/2003 | Garrity et al. | 341/163 |
| 6,617,992 B2 | 9/2003 | Sakurai | |
| 6,741,194 B1 | 5/2004 | Cassagnes et al. | |
| 6,909,393 B2 | 6/2005 | Atriss et al. | |
| 6,967,611 B2 | 11/2005 | Atriss et al. | |
| 7,009,549 B1 | 3/2006 | Corsi | |
| 7,015,852 B1 | 3/2006 | Atris et al. | |
| 7,064,700 B1 | 6/2006 | Garrity et al. | |
| 7,068,202 B2 | 6/2006 | Waltari | |
| 7,102,365 B1 | 9/2006 | Atris et al. | |
| 7,282,929 B2 | 10/2007 | Atris et al. | |
| 7,289,052 B1 | 10/2007 | Artis et al. | |
| 7,307,572 B2 | 12/2007 | Garrity et al. | |
| 7,345,615 B2 * | 3/2008 | Kawahito | 341/162 |

(Continued)

OTHER PUBLICATIONS

STMicroelectronics; ST10F397 Target Specification; Analog/Digital Converter; pp. 349-352.

(Continued)

*Primary Examiner*—Brian Young

(57) ABSTRACT

An analog-to-digital converter (ADC) device includes an input terminal to receive an analog signal, an analog component, and control logic. The analog component includes an amplifier having an input and an output and a capacitor network coupled to the input and the output of the amplifier. The capacitor network comprises a plurality of capacitors. The control logic is configured to, in a first mode, configure the capacitor network and the amplifier in an amplification configuration to amplify the analog signal by a predetermined gain to generate an amplified analog signal. The control logic further is configured to, in a second mode, configure the capacitor network and the amplifier to generate a series of one or more residue voltages using the amplified analog signal.

18 Claims, 9 Drawing Sheets

U.S. PATENT DOCUMENTS

2004/0233092 A1  11/2004  Hong
2005/0219097 A1  10/2005  Atriss et al.
2006/0279293 A1  12/2006  Atris et al.
2006/0284754 A1  12/2006  Garrity et al.
2007/0247345 A1  10/2007  Atris et al.

OTHER PUBLICATIONS

Infineon Technologies; TC1796; Analog-to-Digital Converter (ADC0, ADC1); Data Sheets; pp. 55-58 and 71, 81-88; Vo.2, Jan. 2005, Sep. 2005.

STMicroelectronics; L9119; Knock Sensor Interface;Feb. 26, 1999; pp. 1-23; Rev. 0.3.

Garcia, et al.; INTERSIL; Measuring Spurious Free Dynamic Range in a D/A Converter; Technical Brief TB326; 1999; pp. 1-2.

Carley, L. Richard; A Noise-Shaping Coder Topology for 15+ Bit Converters, IEEE Journal of Solid-State Circuits, vol. 24, No. 2, Apr. 1989; pp. 267-273.

U.S. Appl. No. 11/674,435, filed Feb. 13, 2007.

Ginetti, Bernard et al., "A CMOS 13-b Cyclic RSD A/D Converter," IEEE Journal of Solid-State Circuits, vol. 27, No. 7, Jul. 1992.

\* cited by examiner

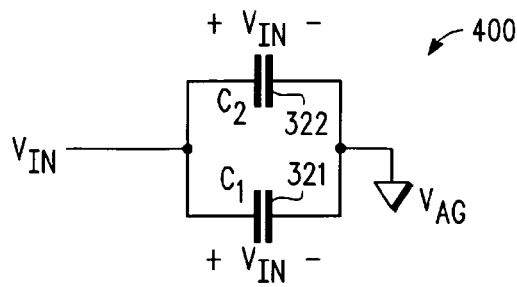
FIG. 4 (CYCLE 1, PHASE 1)
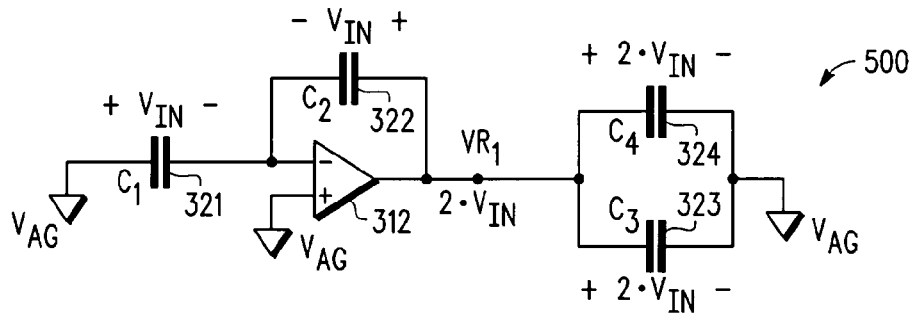
FIG. 5 (CYCLE 1, PHASE 2)
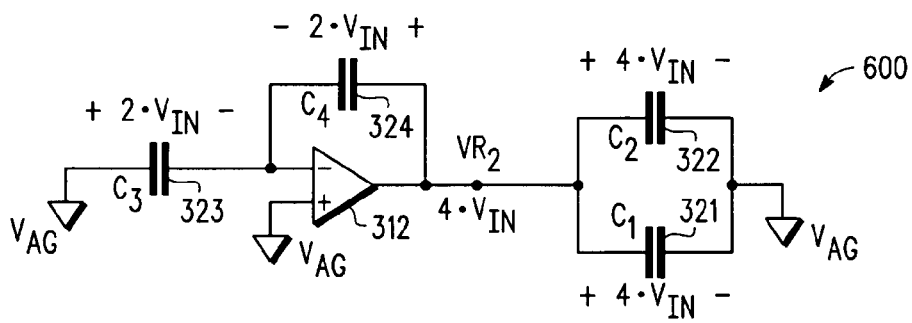
FIG. 6 (CYCLE 2, PHASE 1)
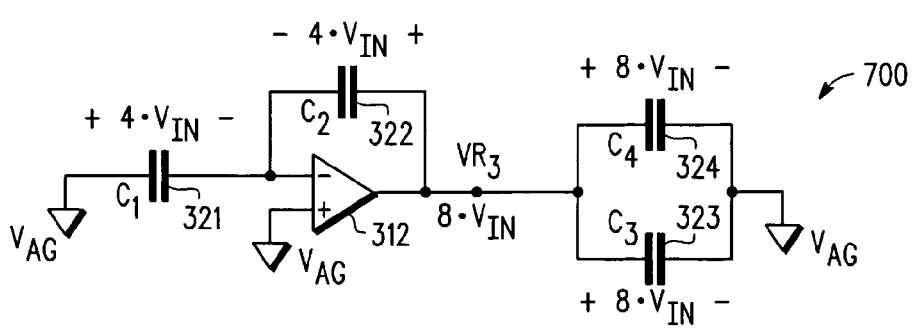
FIG. 7 (CYCLE 2, PHASE 2)

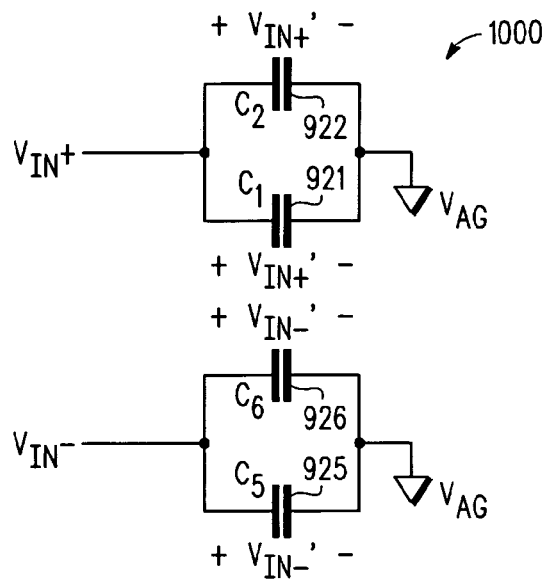
FIG. 10 (CYCLE 1, PHASE 1)
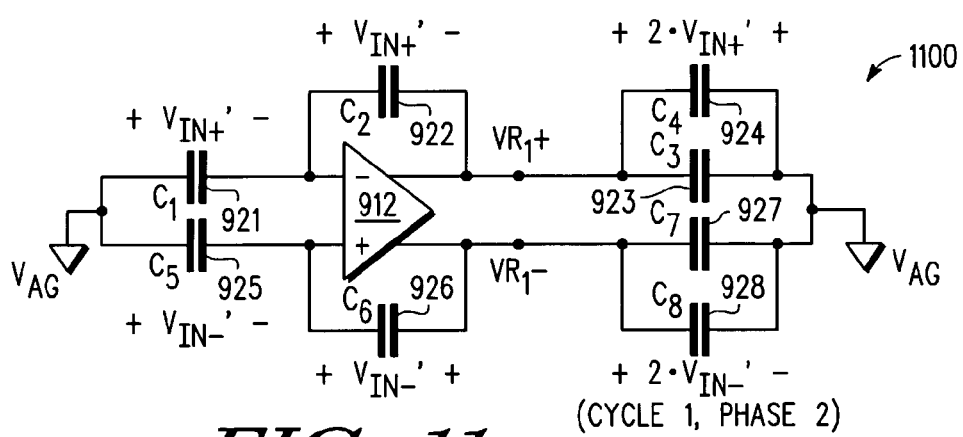
FIG. 11 (CYCLE 1, PHASE 2)
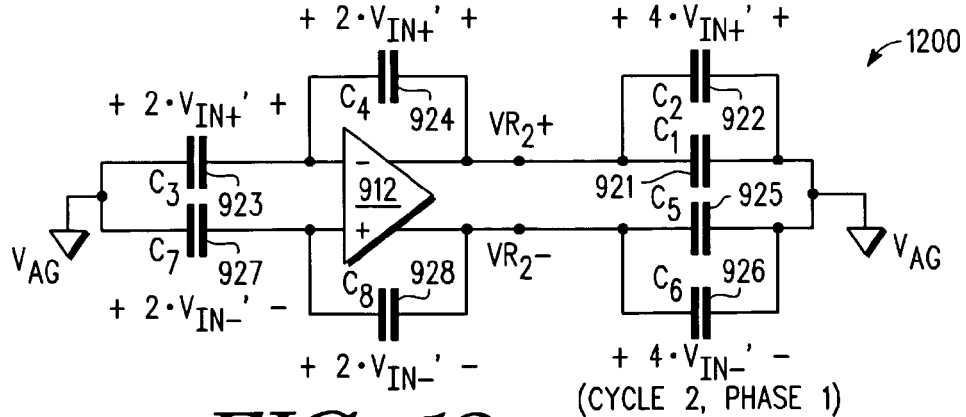
FIG. 12 (CYCLE 2, PHASE 1)

(CYCLE 1, PHASE 1)

(CYCLE 1, PHASE 2)

(CYCLE 1, PHASE 2)

ANALOG-TO-DIGITAL CONVERTER WITH VARIABLE GAIN AND METHOD THEREOF

FIELD OF THE DISCLOSURE

The present disclosure relates generally to analog-to-digital conversion and more particularly to redundant signed digit (RSD)-based analog-to-digital conversion.

BACKGROUND

Mixed analog and digital devices utilize analog-to-digital converters (ADCs) to convert the voltages of analog signals to corresponding digital values for use by digital components of the devices. Redundant signed digit (RSD)-based ADCs often find particular benefit in certain types of systems, particularly where power and space are at a premium. RSD ADCs typically convert an analog signal to a corresponding digital value through a series of stages. During the initial state, the voltage of the input analog signal is compared to two or more reference voltages, e.g., VH and VL, and the results of these comparisons result in code bits for the initial stage. An analog circuit comprising an amplifier and a set of capacitors is used to determine a residue voltage, and for the second stage the process of comparisons with the reference voltages is repeated with the residue voltage to generate code bits for the second stage. This process of calculating the residue voltage from the residue voltage of the previous stage and comparing the resulting residue voltage to generate code values can be repeated for a number of stages until the appropriate resolution is reached. An RSD algorithm then is applied to the code values from each stage to generate a digital value representative of the analog signal.

In some operating environments, different analog signal sources may utilize the same RSD ADC, but may operate at different voltage levels. To illustrate, in an automotive environment, different sensors may provide sensor output signals with different voltage levels for conversion to digital values for processing by the same control processor. In order to ensure proper conversion, each of input analog signals typically needs to be scaled to a predetermined voltage level before conversion. In conventional devices, this scaling is achieved through gain circuitry prior to the input of the RSD ADC. This separate gain circuitry complicates the design and integration of an RSD ADC, as well as adding to the size and power consumption of the integrated circuit in which the RSD ADC is implemented. Accordingly, an improved technique for scaling analog signals for digital conversion would be advantageous.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

FIG. 4 is a circuit diagram illustrating a first capacitor configuration of the single-ended RSD ADC of FIG. 3 for sampling an input analog signal in accordance with at least one embodiment of the present disclosure.

FIG. 5 is a circuit diagram illustrating a second capacitor configuration of the single-ended RSD ADC of FIG. 3 for amplifying the input analog signal of FIG. 4 and for sampling the resulting amplified analog signal in accordance with at least one embodiment of the present disclosure.

FIG. 6 is a circuit diagram illustrating a third capacitor configuration of the single-ended RSD ADC of FIG. 3 for amplifying the amplified analog signal of FIG. 5 and for sampling the resulting amplified analog signal in accordance with at least one embodiment of the present disclosure.

FIG. 7 is a circuit diagram illustrating a fourth capacitor configuration of the single-ended RSD ADC of FIG. 3 for amplifying the amplified analog signal of FIG. 6 and sampling the resulting amplified analog signal in accordance with at least one embodiment of the present disclosure.

FIG. 10 is a circuit diagram illustrating a first capacitor configuration of the differential signaling-based RSD ADC of FIG. 9 for sampling an input analog signal in accordance with at least one embodiment of the present disclosure.

FIG. 11 is a circuit diagram illustrating a second capacitor configuration of the differential signaling-based RSD ADC of FIG. 9 for amplifying the input analog signal of FIG. 10 and for sampling the resulting amplified analog signal in accordance with at least one embodiment of the present disclosure.

FIG. 12 is a circuit diagram illustrating a third capacitor configuration of the differential signaling-based RSD ADC of FIG. 9 for amplifying the amplified analog signal of FIG. 1 and for sampling the resulting amplified analog signal in accordance with at least one embodiment of the present disclosure.

DETAILED DESCRIPTION

Figure 1:
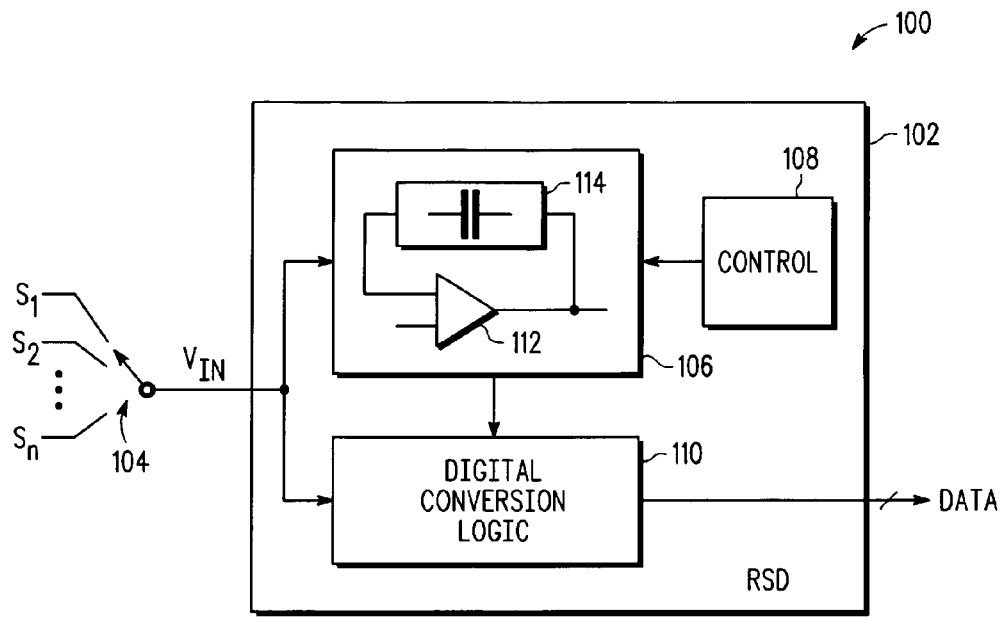
FIG. 1 is a diagram illustrating an example redundant signed digit (RSD) analog-to-digital converter (ADC) utilizing an integrated variable gain stage in accordance with at least one embodiment of the present disclosure.

In accordance with one aspect of the present disclosure, a redundant signed digit (RSD) analog-to-digital converter (ADC) device includes an input terminal to receive an analog signal, an analog component, and control logic. The analog component includes an amplifier having an input and an output and a capacitor network coupled to the input and the output of the amplifier. The capacitor network comprising a plurality of capacitors. The control logic is configured to, in a first mode, configure the capacitor network and the amplifier in an amplification configuration to amplify the analog signal by a predetermined gain to generate an amplified analog signal. The control logic further is configured to, in a second mode, configure the capacitor network and the amplifier in an RSD configuration to generate a series of one or more residue voltages using the amplified analog signal.

In accordance with another aspect of the present disclosure, a method includes receiving an analog signal at an input terminal of an RSD ADC and configuring a capacitor network and an amplifier of the RSD ADC to amplify the analog signal by a predetermined gain to generate an amplified analog signal. The method further includes configuring the capacitor network and the amplifier to generate a series of one or more residue voltages based on the amplified analog signal. The method additionally includes providing for output from the RSD ADC a digital value based on the series of one or more residue voltages.

FIGS. 1-17 illustrate example techniques for conversion of analog signals to corresponding digital values using a redundant signed digit (RSD) analog-to-digital converter (ADC) employing an integrated variable gain stage for the input analog signals. An amplifier and a capacitor network of the analog component of the RSD ADC are used both to amplify an input analog signal and to calculate residue voltages for RSD conversion. In one embodiment, the capacitors can be arranged into a sequence of capacitor configurations so as to recursively amplify the input analog signal to a predetermined voltage level, and once amplified, the capacitors can be reconfigured to generate a series of one or more RSD residue voltages starting with the amplified analog signal. In another embodiment, programmable capacitors having adjustable capacitance can be configured to certain capacitances so as to provide a predetermined gain for amplifying an input analog signal to a predetermined voltage level. The programmable capacitors then can be reconfigured to other capacitances for performing RSD residue voltage calculation starting with the amplified analog signal. This dual use of the capacitors and amplifier of the RSD ADC for both variable gain of an input analog signal and for RSD residue voltages using the amplified analog signal can reduce the size, complexity, and power consumption of the RSD ADC compared to conventional RSD ADC implementations having a separate front-end gain circuit.

The term "capacitor," as used herein, refers to one or more capacitive elements configured to, or configurable to, provide a particular capacitance. To illustrate, a capacitor can be implemented as a single capacitive element that provides the particular capacitance, or as a network of capacitive elements connected in parallel, in series, or a combination thereof, to provide the particular capacitance. A capacitor can be implemented as an integrated capacitor (e.g., one or more capacitive structures implemented at one or more layers of an integrated circuit) or as a discrete capacitor. Further, as described in greater detail herein, a capacitor can comprise a programmable capacitor having an adjustable capacitance, an example of which is described in U.S. Pat. No. 5,625,361, the entirety of which is incorporated by reference herein.

For ease of illustration, the techniques disclosed herein are described in the example context of an example RSD implementation whereby a single RSD stage is used to recursively pass through a sequence of sample and amplification cycles such that the residue voltage output from the RSD stage for one sample stage is used in calculating the next residue voltage during the next sample stage. An example of a cyclic single-stage RSD implementation is described in U.S. Pat. No. 6,535,157, the entirety of which is incorporated by reference herein. In other embodiments, the disclosed techniques can be adapted for use in an RSD implementation having a sequence of two or more RSD stages, where the residue voltage output by one RSD stage is input to the next RSD stage. An example of a multiple-stage RSD implementation is described in U.S. Pat. No. 5,664,313, the entirety of which is incorporated by reference herein.

FIG. 1 illustrates an example analog-to-digital (A/D) conversion system 100 in accordance with at least one embodiment of the present disclosure. The A/D conversion system 100 includes a RSD ADC 102 comprising an input terminal to receive an analog signal having a voltage $V_{IN}$ from a voltage selector 104 and an output to provide a digital value ("DATA") representative of the voltage $V_{IN}$. The RSD ADC 102 includes an analog component 106, control logic 108, and digital conversion logic 110. The analog component 106 includes a gain circuit comprising an amplifier 112 and a capacitor network 114 comprising a plurality of capacitors that can be arranged in a number of configurations as described herein, both to amplify the input analog signal and then to generate a series of residue voltages using the amplified signal.

In at least one embodiment, the A/D conversion system 100 is implemented in an environment whereby the analog signals to be converted have different voltage levels. To illustrate, the A/D conversion system 100 may be implemented in an automotive environment so as to convert output signals from a variety of automotive sensors into their corresponding digital values. Accordingly, the voltage selector 104 receives as inputs a plurality of analog signals ($S_1 \ldots S_n$) that may have different voltage levels and selects one of the analog signals for input to the RSD ADC 102. In order to properly convert analog signals to their corresponding values when the analog signals can have different voltage levels, the RSD ADC 102 amplifies the input signal to a common voltage level and then converts the amplified signal to a corresponding digital value. To illustrate, if there are three different voltage levels, e.g., 1 volts, 2 volts, and 4 volts, analog signals at the 1 volt level could be amplified by a gain of 4 and analog signals at the 2 volt level could be amplified by a gain of two so that all of the analog signals are processed at the 4 volt level.

For the initial amplification of the input signal, the control logic 108 configures the amplifier 112 and the capacitor network 114 into a sequence of one or more capacitor configurations so as to achieve a desired amplification of the input signal. The control logic 108 then configures the amplifier 112 and the capacitor network 114 into a sequence of RSD configurations for redundant signed digit calculation starting with the amplified input signal. An example single-ended implementation of the analog component 106 using multiple capacitor configurations is described below with reference to FIGS. 3-8 and a differential signal-based implementation of the analog component 106 is described below with reference to FIGS. 9-12. An example implementation of the analog component 106 configured for single-ended to differential conversion with or without concurrent amplification is illustrated below with reference to FIGS. 9 and 13-15. A programmable capacitor-based implementation of the analog component 106 is described below with reference to FIGS. 16 and 17.

For each RSD calculation stage, the digital conversion logic 110 compares a resulting voltage (initially, the voltage of the amplified analog signal and subsequently, the residue voltages) to generate code values for each RSD calculation stage. The digital conversion logic 110 then aligns, synchronizes, and adds the code bits values from the RSD calculation stages to generate the output digital value DATA in accordance with an RSD algorithm. An example of the process of generating a digital value from code bits is described in the aforementioned U.S. Pat. No. 5,644,313.

Figure 2:
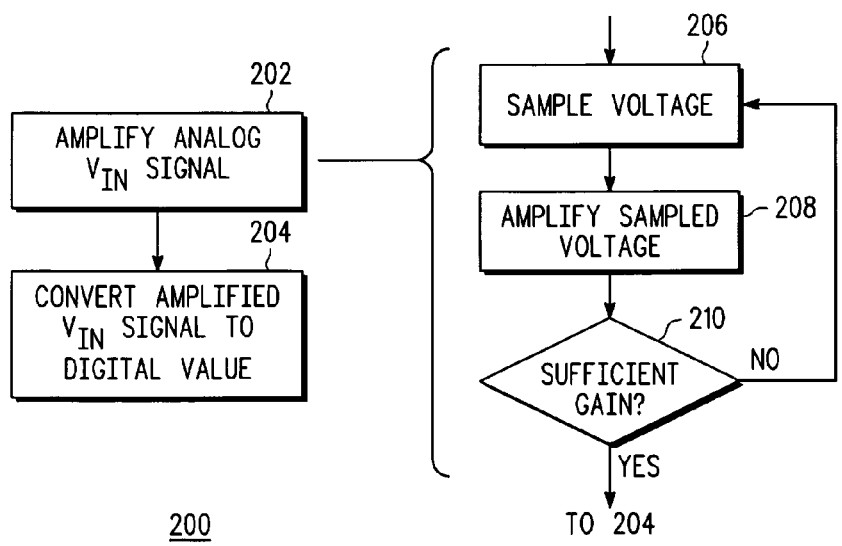
FIG. 2 is a flow diagram illustrating an example operation of the RSD ADC of FIG. 1 in accordance with at least one embodiment of the present disclosure.

FIG. 2 illustrates a method 200 of an example conversion of an analog signal having a voltage $V_{IN}$ by RSD ADC 102 of FIG. 1 in accordance with at least one embodiment of the present disclosure. The method 200 includes an amplification mode (block 202) followed by a RSD conversion mode (block 204). The processes of block 202 are represented by blocks 206, 208, and 210.

At block 202, an input analog signal is received at the RSD ADC 102 and the control logic 108 determines whether the input analog signal is configured to be amplified to a higher voltage level (e.g., from a 4 volt level to a 16 volt level). If amplification is needed, the control logic 108 configures the capacitor network 114 into an initial sampling configuration so as to sample the voltage $V_{IN}$ of the input analog signal at block 206. At block 208 the control logic 108 configures the capacitor network 114 into an amplification configuration so as to amplify the voltage $V_{IN}$ using voltages across capacitors of the capacitor network 114 resulting from the sampling process of block 206. In one embodiment, the gain of the amplification configuration is limited by various characteristics, such as the relative capacitances of the capacitors, and the voltage $V_{IN}$ therefore may not be sufficiently amplified after the initial application of the processes of blocks 206 and 208. Accordingly, the processes of blocks 206 can be repeated one or more time on the resulting amplified voltage until the desired amplification of the voltage $V_{IN}$ is reached. To illustrate, assume that the input analog signal has a voltage level of 4 volts, the RSD ADC 102 is configured to convert voltages at a 16 volt level, and the analog component 106 is configurable to provide a 2× gain at each iteration. In this case, a gain of 4× is needed to amplify the voltage $V_{IN}$ from a 4 volt level to a 16 volt level and thus the amplification process is repeated twice to achieve the 4× gain. After the first pass of the processes of blocks 206 and 208, the voltage $V_{IN}$ is amplified to $V_{amp1}=2\times V_{IN}$. After the second pass of the processes of blocks 206 and 208, the amplified voltage $V_{amp1}$ is amplified to $V_{amp2}=2\times V_{amp1}=4\times V_{IN}$. Once a sufficient gain has been achieved at block 210, the method 200 continues to block 204.

At block 204, the control logic 108 configures the capacitor network 114 into a series of RSD configurations and the amplified voltage is converted to a digital value via the analog component 106 and the digital conversion logic 110 using an RSD conversion process, such as the ones described in the aforementioned U.S. Pat. Nos. 5,644,313 and 6,535,157. The resulting digital value then can be processed by digital components of the system as appropriate.

Figure 3:
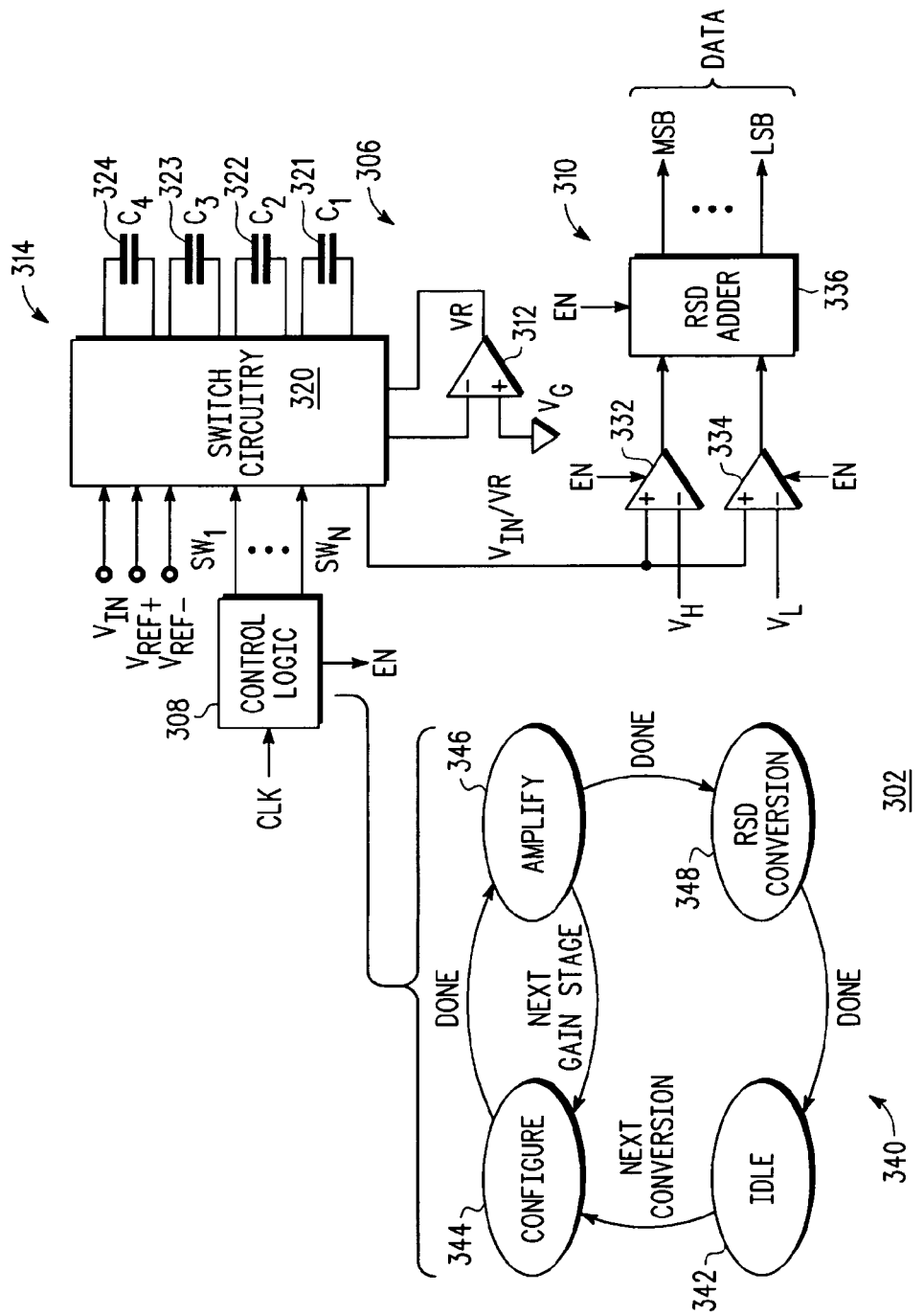
FIG. 3 is a diagram illustrating an example single-ended implementation of the RSD ADC of FIG. 1 that utilizes multiple capacitor configurations in accordance with at least one embodiment of the present disclosure.

FIG. 3 illustrates an example single-ended implementation of an RSD ADC in accordance with at least one embodiment of the present disclosure. The illustrated RSD ADC 302 (corresponding to the RSD ADC 102 of FIG. 1) includes an analog component 306, control logic 308, and digital conversion logic 310. The analog component 306 includes an amplifier 312, a capacitor network 314 comprising switch circuitry 320 and a plurality of capacitors, such as the four capacitors 321, 322, 323, and 324 (collectively, capacitors 321-324). The switch circuitry 320 includes a plurality of switches (e.g., transistors or pass gates), a terminal connected to an input terminal of the amplifier 312 (e.g., the negative (−) input terminal) and a terminal connected to the output terminal of the amplifier 312. The switch circuitry 320 further includes inputs to receive the input analog signal ($V_{IN}$), one or more reference voltages (e.g., $V_{REF+}$ and $V_{REF-}$), and a plurality of switch control signals SW1-SWn. The switch control signals are routed to the switches so as to affect various configurations of the capacitors 321-324 as described in greater detail herein. The switch circuitry 320 further comprises an output to provide an output voltage, whereby the output voltage comprises either the voltage $V_{IN}$, an amplified version of the voltage $V_{IN}$, or a residue voltage (VR) depending on the particular stage of operation of the RSD ADC 302.

The control logic 308 includes an input to receive one or more clock signals (CLK) and outputs to provide an enable (EN) signal and the switch control signals SW1-SWn. In at least one embodiment, the control logic 308 configures the switch control signals SW1-SWn and the EN signal so as to affect various configurations of the capacitors 321-324 via the switch circuitry 320 and to enable or disable the digital conversion logic 310 based on the phases of the one or more clock signals.

The digital conversion logic 310 includes comparators 332 and 334 and an RSD adder 336. The comparator 332 includes an input to receive the output voltage from the switch circuitry 320, an input to receive a first reference voltage (VH), and an output to provide a value based on a comparison of the output voltage to the first reference voltage. The comparator 334 includes an input to receive the output voltage of the switch circuitry 320, an input to receive a second reference voltage (VL), and an output to provide a value based on a comparison of the output voltage to the second reference voltage. The RSD adder 336 includes inputs to receive the values from the comparators 332 and 334 and a plurality of outputs to provide corresponding bits of the output digital value ("DATA") based on an alignment, synchronization, and addition process applied to a sequence of values output by the comparators 332 and 334 during the corresponding RSD stages performed for converting the input analog signal to a digital value. Further, in one embodiment, the control logic 308 receive the values from the comparators 332 and 334 and generates three signals (h, l, and m) based on the values from the comparators 332 and 334 so as to control the introduction of $V_{REF+}$ or $V_{REF-}$ during the RSD conversion process. The comparators 332 and 334 and the RSD adder 336 further can include inputs to receive the EN signal from the control logic 308, whereby these components are disabled (e.g., clock gated or disconnected from power) when the EN signal is placed in a disable state (e.g., deasserted).

In at least one embodiment, the control logic 308 implements a hardware state machine having an operation represented by the state diagram 340 of FIG. 3. At an idle state 342, the control logic 308 configures the EN signal to the disabled state, thereby idling components of the RSD ADC 302. In response to receipt of an input analog signal to be converted by the RSD ADC 302, the state machine enters configure/sample state 344. At configure/sample state 344, the control logic 308 initially determines the gain needed to amplify the input analog signal to the conversion voltage level used by the RSD ADC 302, and based on the determined gain, the number of amplification stages needed to amplify the input analog signal to the conversion voltage level. To illustrate, if a gain of 8× is needed to convert the input analog signal to the conversion voltage level and each amplification stage provides a 2× gain, a sequence of three amplification stages will be needed for the desired amplification.

When the configure/sample state 344 is initially entered from idle state 342, the control logic 308 configures the switch control signals SW1-SWn so as to arrange the capacitors 321-324 in an initial configuration illustrated by stage 1 of FIG. 4 (described below). The state machine then enters amplify state 346 whereby the amplifier 312 and the capacitor configuration of stage 1 are used to amplify the input analog signal to generate an amplified analog signal. If this amount of application is sufficient, the state machine enters RSD conversion state 348, whereby the control logic 308 configures the switch control signals SW1-SWn so as to arrange the capacitors 321-324 in a sequence of RSD stage configurations and configures the EN signal to an enabled state so as to enable the digital conversion logic 310. The analog component 306 and the digital conversion logic 310 then are operated to convert the voltage of the amplified analog signal to a corresponding digital value based on a series of residual voltages determined from the amplified analog signal.

In the event that additional amplification is needed before conversion, the state machine reenters configure/sample state 344. The control logic 308 configures the switch control signals SW1-SW5 so as to arrange the capacitors 321-324 in a configuration illustrated by FIG. 5. The state machine then enters amplify state 346 whereby the amplifier 312 and the capacitor configuration of FIG. 5 is used to amplify the amplified analog signal to generate a second amplified analog signal. If this amount of amplification is sufficient, the state machine enters RSD conversion state 348 using the second amplified analog signal. Otherwise, if additional amplification is needed, the configuration and amplification performed at states 344 and 346 can be repeated one or more times to achieve the desired amplification level before entering the RSD conversion state 348.

FIGS. 4-7 illustrate a sequence of capacitor configurations that can be utilized to achieve a particular amplification of an input signal in accordance with at least one embodiment of the present disclosure. For ease of illustration, the sequence of capacitor configurations is described in the context of the RSD ADC 302 of FIG. 3. The illustrated configurations are achieved via configurations of switches of switch circuitry 320, but for clarity purposes the switches are omitted from the illustrated configurations of FIGS. 4-7.

FIG. 4 illustrates an initial sampling configuration 400 of the capacitor 321 ($C_1$) and capacitor 322 ($C_2$) at a first phase of a first cycle of a clock signal (CLK). The first terminal of the capacitor 321 and the first terminal of the capacitor 322 are connected to the input analog voltage so as to receive the voltage $V_{IN}$. The second terminal of the capacitor 321 and the second terminal of the capacitor 322 are connected to a voltage reference $V_{AG}$, where $V_{AG}$ represents the analog ground voltage reference. As illustrated by FIG. 4, the initial sampling configuration 400 results in the voltage $V_{IN}$ across each of the capacitors 321 and 322.

FIG. 5 illustrates an amplification configuration 500 of the capacitor 321 ($C_1$), the capacitor 322 ($C_2$), the capacitor 323 ($C_3$), and the capacitor 324 ($C_4$) at a second phase of the first cycle of the clock signal. The first terminal and the second terminal of the capacitor 321 are connected to the voltage reference $V_{AG}$ and the negative input terminal of the amplifier 312, respectively. The first terminal and the second terminal of the capacitor 322 are connected to the output terminal and the negative input terminal, respectively, of the amplifier 312. The positive input terminal of the amplifier 312 is connected to the voltage reference $V_{AG}$. The first terminal of the capacitor 323 and the first terminal of the capacitor 324 are connected to the output terminal of the amplifier 312 and the second terminal of the capacitor 323 and the second terminal of the capacitor 324 are connected to the voltage reference $V_{AG}$.

For the amplification configuration 500, the capacitors 321 and 322 are reconfigured from the initial sampling configuration 400 of FIG. 4 via the switch circuitry 320 without substantial discharge of the capacitors 321 and 322. In this configuration, it will be appreciated that the output voltage ($VR_1$) of the amplifier 312 is $2*V_{IN}$. Further, in this configuration the output of the amplifier 312 drives charge into the capacitors 323 and 324 so that the voltage difference between the first terminals of the capacitors 323 and 324 and their second terminals is equal to $VR_1$, or $2*V_{IN}$. In the event that 2× amplification is sufficient, the analog component 306 is arranged into an RSD conversion configuration and the conversion process can be initiated using the 2× amplified analog signal (as represented by the voltage across the terminals of the capacitors 323 and 324).

Otherwise, additional amplification can be achieved via the amplification configuration 600 of FIG. 6 at the first phase of a second cycle of the clock signal. In the amplification configuration 600, the first terminal and the second terminal of the capacitor 323 are connected to the voltage reference $V_{AG}$ and the negative input terminal of the amplifier 312, respectively. The first terminal and the second terminal of the capacitor 324 are connected to the output terminal and the negative input terminal, respectively, of the amplifier 312. The positive input terminal of the amplifier 312 is connected to the voltage reference $V_{AG}$. The first terminal of the capacitor 321 and the first terminal of the capacitor 322 are connected to the output terminal of the amplifier 312 and the second terminal of the capacitor 321 and the second terminal of the capacitor 322 are connected to the voltage reference $V_{AG}$. Thus, it will be appreciated that, between the amplification configuration 500 and the amplification configuration 600, the capacitor 321 and the capacitor 323 effectively switch places and the capacitor 322 and the capacitor 324 effectively switch places.

For the amplification configuration 600, the capacitors 323 and 324 are reconfigured from the amplification configuration 500 of FIG. 5 via the switch circuitry 320 without substantial discharge of the capacitors 323 and 324. In this configuration, it will be appreciated that the output voltage ($VR_2$) of the amplifier 312 is $4*V_{IN}$ (i.e., $2*2*V_{IN}$). Further, in this configuration the output of the amplifier 312 drives charge into the capacitors 321 and 322 so that the voltage difference between the first terminals of the capacitors 321 and 322 and their second terminals is equal to $VR_2$, or $4*V_{IN}$. In the event that 4× amplification is sufficient, the control logic 308 can configure the analog component 306 into an RSD stage and the RSD conversion process can be initiated using the output voltage $VR_2$ of the amplifier 312 (as present across the terminals of the capacitors 321 and 322).

Otherwise, additional amplification can be achieved via the amplification configuration 700 of FIG. 7 at the second phase of the second cycle of the clock signal. It will be appreciated from a comparison of FIGS. 5 and 6 that the capacitor connections of the amplification configuration 700 are the same as the capacitor connections of the amplification configuration 500. A difference, however, is that for the amplification configuration 700, the capacitors 321 and 322 are reconfigured from the amplification configuration 600 of FIG. 6 via the switch circuitry 320 without substantial discharge of the capacitors 321 and 322. Thus, it will be appreciated that, between the amplification configuration 600 and the amplification configuration 700, the capacitor 321 and the capacitor 323 switch places and the capacitor 322 and the capacitor 324 switch places. In this configuration, it will be appreciated that the output voltage (VR$_3$) of the amplifier 312 is 8*V$_{IN}$ (i.e., 2*4*V$_{IN}$). Further, the output of the amplifier 312 drives charge into the capacitors 323 and 324 so that the voltage difference between the first terminals of the capacitors 323 and 324 and their second terminals is equal to VR$_3$, or 8*V$_{IN}$. In the event that 8× amplification is sufficient, the control logic 308 can configure the analog component 306 into an RSD stage and the RSD conversion process can be initiated using the output voltage VR$_3$ of the amplifier 312 (as present across the terminals of the capacitors 321 and 322).

In the event that an amplification greater than 8× (and being a power of two) is needed, a sequence of configurations alternating between the amplification configuration 600 and the amplification configuration 700 can be performed until the desired amplification is achieved.

As FIGS. 4-7 illustrate, the capacitors 321-324 are arranged as two pairs: capacitors 321 and 322 as one pair and capacitors 323 and 324 as another pair. For each amplification pass, a first pair of capacitors is arranged in an amplification configuration and the second pair is arranged in a sampling configuration. For the next amplification pass, the second pair is rearranged into the amplification configuration (without substantial discharge of their stored charges) and the first pair is rearranged into the sampling configuration. For the following amplification pass, the first pair is again arranged in the amplification configuration (without substantial discharge of their stored charges) and the second pair is again arranged in the sampling configuration, and so on between amplification iterations. Thus, it will be appreciated a sequence of amplification iterations whereby the four capacitors 321-324 are swapped between amplification stages can be used to implement any of a variety of gains that are a power of two without requiring a larger capacitor network or complex amplification circuitry, which would require considerable space to implement in an integrated circuit, as well as unnecessarily consuming excess power.

Figure 8:
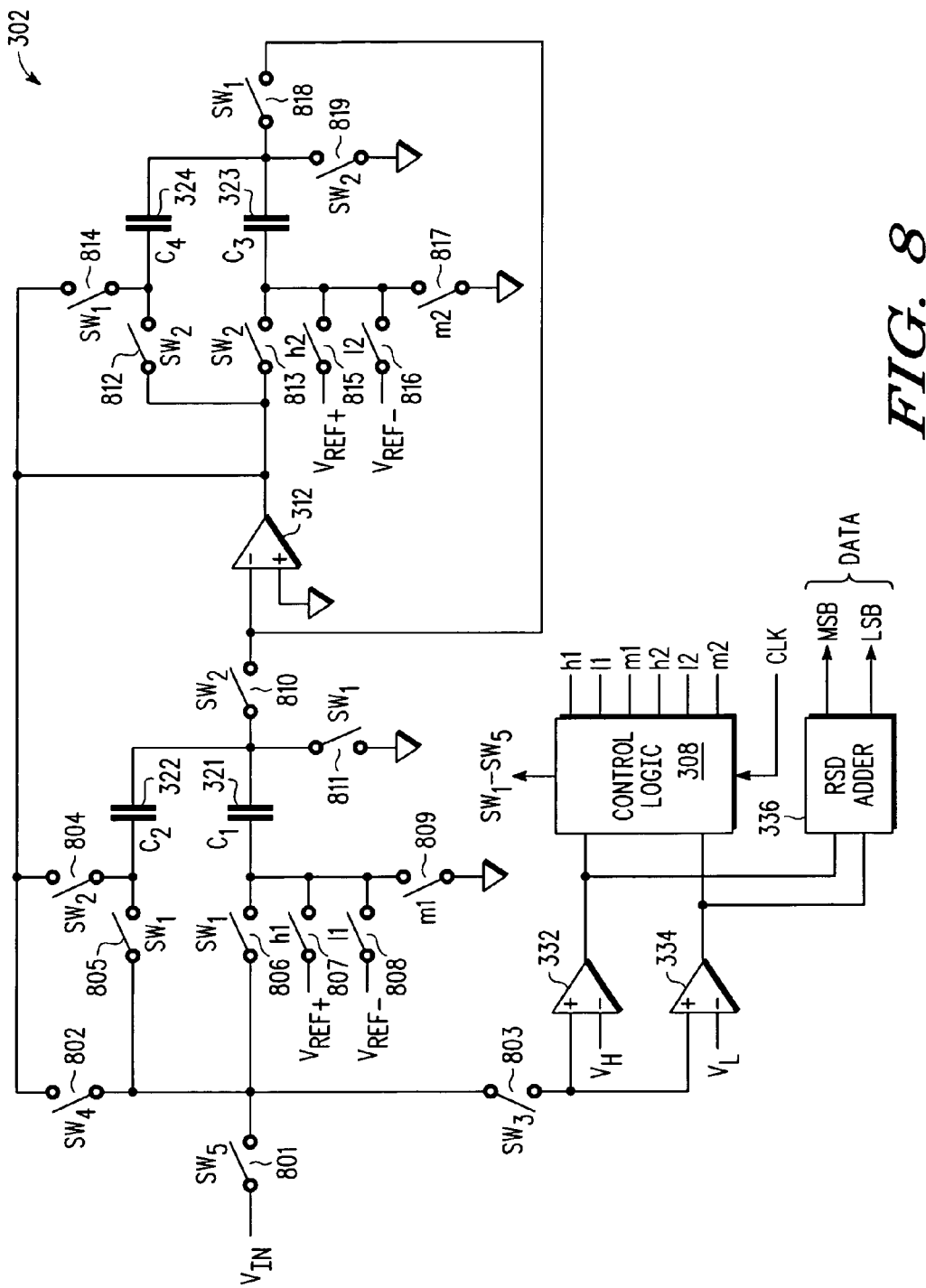
FIG. 8 is a circuit diagram illustrating an example implementation of a capacitor network of the single-ended RSD ADC of FIG. 3 in accordance with at least one embodiment of the present disclosure.

FIG. 8 illustrates an example implementation of the RSD ADC 302 of FIG. 3 in accordance with at least one embodiment of the present disclosure. The switch circuitry 320 is implemented as a set of switches 801-819, which can be implemented as transistors, pass gates, etc.

The switch 801 includes a first terminal to receive the input analog signal (V$_{IN}$) and a second terminal, and is controlled by switch control signal SW5. The switch 802 includes a first terminal connected to the second terminal of the switch 801 and a second terminal connected to the output of the amplifier 312, and is controlled by switch control signal SW4. The switch 803 includes a first terminal connected to the second terminal of the switch 801 and a second terminal connected to the inputs of the comparators 332 and 334, and is controlled by a switch control signal SW3. The switch 804 includes a first terminal connected to the output of the amplifier 312 and a second terminal connected to a first terminal of the capacitor 322, and is controlled by a switch control signal SW2. The switch 805 includes a first terminal connected to the second terminal of the switch 801 and a second terminal connected to the first terminal of the capacitor 322, and is controlled by switch control signal SW1. The switch 806 includes a first terminal connected to the second terminal of the switch 801 and a second terminal connected to the first terminal of the capacitor 321, and is controlled by switch control signal SW1. The switch 807 includes a first terminal to receive the voltage V$_{REF+}$ and a second terminal connected to the first terminal of the capacitor 321, and is controlled by a switch signal h1. The switch 808 includes a first terminal to receive the voltage V$_{REF-}$ and a second terminal connected to the first terminal of the capacitor 321, and is controlled by a switch control signal l1. The switch 809 includes a first terminal connected to the first terminal of the capacitor 321 and a second terminal connected to the voltage reference V$_{AG}$, and is controlled by a switch control signal m1. The switch 810 includes a first terminal connected to the second terminal of the capacitor 321 and the second terminal of the capacitor 322, and a second terminal connected to the negative input of the amplifier 312, and is controlled by the switch control signal SW2. The switch 811 includes a first terminal connected to the second terminals of the capacitors 321 and 322 and a second terminal connected to reference voltage V$_{AG}$, and is controlled by the switch control signal SW1. The switch 812 includes a first terminal connected to the output of the amplifier 312 and a second terminal connected to a first terminal of the capacitor 324, and is controlled by the switch control signal SW2. The switch 813 includes a first terminal connected to the output of the amplifier 312 and a second terminal connected to a first terminal of the capacitor 323, and is controlled by the switch control signal SW2. The switch 814 includes a first terminal connected to the first terminal of the capacitor 324 and a second terminal connected to the output of the amplifier 312, and is controlled by the switch control signal SW1. The switch 815 includes a first terminal to receive the voltage V$_{REF+}$ and a second terminal connected to the first terminal of the capacitor 323, and is controlled by a switch control signal h2. The switch 816 includes a first terminal to receive the voltage V$_{REF-}$ and a second terminal connected to the first terminal of the capacitor 323, and is controlled by a switch control signal l2. The switch 817 includes a first terminal connected to the first terminal of the capacitor 323 and a second terminal connected to the voltage reference V$_{AG}$, and is controlled by a switch control signal m2. The switch 818 includes a first terminal connected to a second terminal of the capacitor 323 and a second terminal of the capacitor 324, and a second terminal connected to the negative input of the amplifier 312, and is controlled by the switch signal SW1. The switch 819 includes a first terminal connected to the second terminals of the capacitors 323 and 324, and a second terminal connected to the voltage reference V$_{AG}$, and is controlled by the switch signal SW2.

In the depicted example, the control logic 308 includes an input to receive the clock signal (CLK), an input coupled to the output of the comparator 332, an input coupled to the output of the comparator 334, and outputs to provide the switch control signals SW1-SW5, h1, h2, l1, l2, m1, and m2 based on the clock signal and the values output by the comparators 332 and 334.

Table 1 below illustrates the various states of the switch control signals set by the control logic 308 to arrange the initial sampling configuration 400 of FIG. 4 and the amplification configurations 500, 600, and 700 of FIGS. 5, 6, and 7, respectively. For Table 1, it is assumed that the values of "0" and "1" set the corresponding switch in an "open" (or non-conductive) state and a "closed" (or conductive) state, respectively, and an "X" is a "don't care" state.

TABLE 1

Settings for Switch Control Signals for Pre-Conversion Amplification

| CLK | Config. 400 (FIG. 4) cycle 1, phase 1 | 500 (FIG. 5) cycle 1, phase 2 | 600 (FIG. 6) cycle 2, phase 1 |
|---|---|---|---|
| SW1 | 1 | 0 | 1 |
| SW2 | 0 | 1 | 0 |
| SW3 | 0 | 0 | 0 |
| SW4 | 0 | X | 1 |
| SW5 | 1 | 0 | 0 |
| h1 | 0 | 0 | 0 |
| l1 | 0 | 0 | 0 |
| m1 | 0 | 1 | 0 |
| h2 | X | 0 | 0 |
| l2 | X | 0 | 0 |
| m2 | X | 0 | 1 |

As illustrated by Table 1, the control logic 308 can implement the different configurations based on the phases of clock cycles of the CLK signal (FIG. 3). Further, as illustrated by Table 1, switch control signal SW1 and switch control signal SW2 can be implemented as complementary signals.

Table 2 below illustrates the various states of the switch control signals set by the control logic 308 to arrange an RSD configuration for conversion of an amplified input signal. For Table 2, it is assumed that the 4× amplification achieved via the sequence of sampling configuration 400, amplification 500, and amplification configuration 600 is the desired gain and thus the RSD configuration is initiated from the amplification configuration 600. Further, for Table 2 only the first four RSD cycles are illustrated, although it will be appreciated that the total number of RSD cycles can depend on the resolution of the particular implementation. In Table 2, the values of "0" and "1" set the corresponding switch in an "open" (or non-conductive) state and a "closed" (or conductive) state, respectively, an "X" is a "don't care" state, and a "D" for switch control signals h1, l1, m1, h2, l2, and m2 indicates that the state of the corresponding signal depends on the voltage of the residue voltage being analyzed as compared with the VH and the VL (i.e., to offset the residue voltage $(VR \pm V_{REF})$ depending on the values output by the comparators 332 and 334).

TABLE 2

Settings for Switch Control Signals for RSD Conversion

| CLK | cycle 2, phase 2 | cycle 3, phase 1 | cycle 3, phase 2 | cycle 4, phase 1 |
|---|---|---|---|---|
| SW1 | 0 | 1 | 0 | 1 |
| SW2 | 1 | 0 | 1 | 0 |
| SW3 | 1 | 1 | 1 | 1 |
| SW4 | 1 | 1 | 1 | 1 |
| SW5 | 0 | 0 | 0 | 0 |
| h1 | D | 0 | D | 0 |
| l1 | D | 0 | D | 0 |
| m1 | D | 0 | D | 0 |
| h2 | 0 | D | 0 | D |
| l2 | 0 | D | 0 | D |
| m2 | 0 | D | 0 | D |

Figure 9:
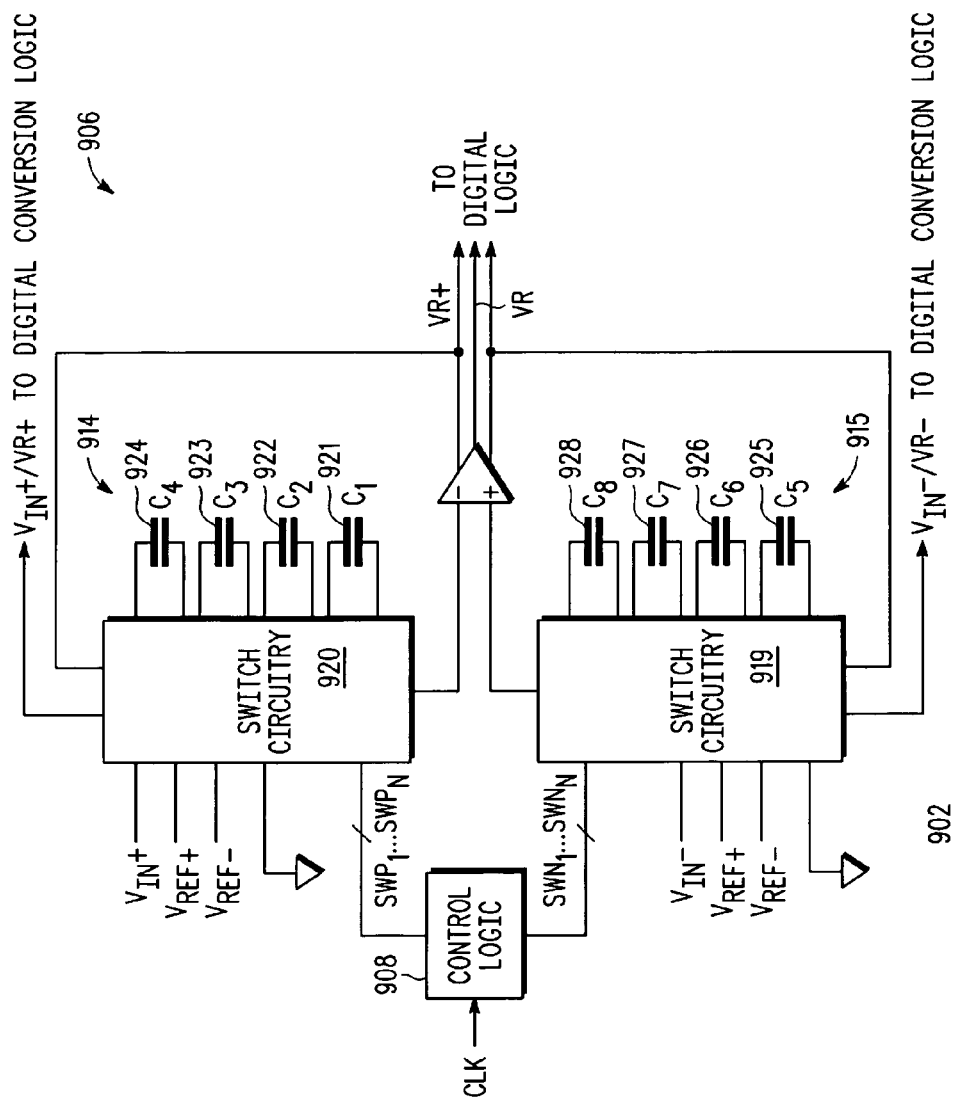
FIG. 9 is a diagram illustrating an example differential signaling-based implementation of the RSD ADC of FIG. 1 that utilizes multiple capacitor configurations in accordance with at least one embodiment of the present disclosure.

FIG. 9 illustrates an example differential signaling-based implementation of an RSD ADC in accordance with at least one embodiment of the present disclosure. The illustrated RSD ADC 902 (corresponding to the RSD ADC 102 of FIG. 1) includes an analog component 906, control logic 908, and digital conversion logic (not shown). The analog component 906 includes a differential amplifier 912 and a capacitor network 914 comprising switch circuitry 920 and a plurality of capacitors, such as the four capacitors 921, 922, 923, and 924 (collectively, capacitors 921-924). The switch circuitry 920 includes a plurality of switches, a terminal connected to an input terminal of the differential amplifier 912 (e.g., the negative (−) input terminal) and a terminal connected to the positive (+) output terminal of the differential amplifier 912. The switch circuitry 920 further includes inputs to receive one component of the differential input analog signal (e.g., $V_{IN+}$), one or more reference voltages (e.g., $V_{REF+}$ and $V_{REF-}$), and a plurality of switch control signals SW1-SWn. The switch control signals SW1-SWn are routed to the switches so as to affect various configurations of the capacitors 921-924. The switch circuitry 920 further comprises an output to provide one component of a differential output signal to the digital conversion logic (not shown), whereby the first component comprises either the component $V_{IN+}$, an amplified version of the component $V_{IN+}$, or a component of the differential residue voltage (e.g., VR+) depending on the particular stage of operation of the RSD ADC 902.

The analog component 906 further includes a capacitor network 915 for the second component of the differential input analog signal (e.g., $V_{IN-}$). The capacitor network 915 comprises switch circuitry 919 (corresponding to the switch circuitry 920) and a plurality of capacitors, such as the four capacitors 925, 926, 927, and 928 (collectively, capacitors 925-928). The switch circuitry 919 includes a plurality of switches, a terminal connected to the other input terminal of the differential amplifier 912 (e.g., the positive (+) input terminal) and a terminal connected to the negative (−) output terminal of the differential amplifier 912. The switch circuitry 919 further includes inputs to receive the other component of the differential input analog signal (e.g., $V_{IN-}$), one or more reference voltages (e.g., $V_{REF+}$ and $V_{REF-}$), and a plurality of switch control signals SWn+1-SWm. The switch control signals are routed to the switches of the switch circuitry 919 so as to affect various configurations of the capacitors 925-928. The switch circuitry 919 further comprises an output to provide the second component of a differential output signal, whereby the second component comprises either the component $V_{IN-}$, an amplified version of the component $V_{IN-}$, or a component of the differential residue voltage (e.g., VR−) depending on the particular stage of operation of the RSD ADC 902. The capacitor networks 914 and 915 each can be implemented in a manner similar to the example of FIG. 8 described above for the single-ended implementation.

The control logic 908 includes an input to receive one or more clock signals (CLK) and outputs to provide an enable (EN) signal and the switch control signals SW1-SWm. In at least one embodiment, the control logic 908 configures the switch control signals and the EN signal so as to affect various configurations of the capacitors 921-928 via the switch circuitry 919 and 920 and to enable or disable the digital conversion logic based on the phases of the one or more clock signals.

In at least one embodiment, the differential signaling-based implementation of FIG. 9 can be used for a single-ended input analog signal. In this instance, the single-ended input analog signal $V_{IN}$ is provided as the first component $V_{IN+}$ and the voltage reference $V_{AG}$ is supplied as the second component $V_{IN-}$. Thus, the RSD ADC 902 has the added feature of converting a single-ended input analog signal to a differential signal before amplification and conversion.

In at least one embodiment, the control logic 908 implements a hardware state machine having an operation similar to that of the state diagram 340 of FIG. 3 described above. As with the control logic 308 of the single-ended implementation of FIG. 3, the control logic 908 of the differential signal-based implementation arranges the capacitors 921-928 into different configurations so as to achieve one or more amplification passes to incrementally amplify the input analog signal (as either a true differential signal at the input or a single-ended signal converted to a differential signal).

FIGS. 10-12 illustrate a sequence of capacitor configurations that can be utilized to achieve a particular amplification of a differential input signal in accordance with at least one embodiment of the present disclosure. For ease of illustration, the sequence of capacitor configurations is described in the context of the RSD ADC 902 of FIG. 9. The illustrated configurations are achieved via configurations of switches of switch circuitry 920 and switch circuitry 919, but for clarity purposes the switches are omitted from the illustrated configurations of FIGS. 10-12.

FIG. 10 illustrates an initial sampling configuration 1000 of the capacitors 921, 922, 925, and 926 ($C_1$, $C_2$, $C_5$, and $C_6$) at a first phase of a first cycle of a clock signal. The first terminal of the capacitor 921 and the first terminal of the capacitor 922 are connected to the first component of the input analog voltage so as to receive the voltage $V_{IN+}$. The second terminal of the capacitor 921 and the second terminal of the capacitor 922 are connected to the voltage reference $V_{AG}$. Likewise, the first terminal of the capacitor 925 and the first terminal of the capacitor 926 are connected to the second component of the input analog voltage so as to receive the voltage $V_{IN-}$ and the second terminal of the capacitor 925 and the second terminal of the capacitor 926 are connected to the voltage reference $V_{AG}$. As illustrated by FIG. 10, the initial sampling configuration 1000 results in a voltage $V_{IN+}$ across each of the capacitors 921 and 922 and the voltage $V_{IN-}$ across each of the capacitors 925 and 926.

FIG. 11 illustrates an amplification configuration 1100 of the capacitors 921-928 at a second phase of the first cycle of the clock signal. The first terminal and the second terminal of the capacitor 921 are connected to the voltage reference $V_{AG}$ and the negative input terminal of the differential amplifier 912, respectively. The first terminal and the second terminal of the capacitor 922 are connected to the positive output terminal and the negative input terminal, respectively, of the differential amplifier 912. The first terminal and the second terminal of the capacitor 925 are connected to the voltage reference $V_{AG}$ and the positive input terminal of the differential amplifier 912, respectively. The first terminal and the second terminal of the capacitor 926 are connected to the negative output terminal and the positive input terminal, respectively, of the differential amplifier 912. The first terminal of the capacitor 923 and the first terminal of the capacitor 924 are connected to the positive output terminal of the differential amplifier 912 and the second terminal of the capacitor 923 and the second terminal of the capacitor 924 are connected to the voltage reference $V_{AG}$. The first terminal of the capacitor 927 and the first terminal of the capacitor 928 are connected to the negative output terminal of the differential amplifier 912 and the second terminal of the capacitor 927 and the second terminal of the capacitor 928 are connected to the voltage reference $V_{AG}$.

For the amplification configuration 1100, the capacitors 921 and 922 are reconfigured from the initial sampling configuration 1000 of FIG. 10 via the switch circuitry 920 without discharging the capacitors 921 and 922. Likewise, the capacitors 925 and 926 are reconfigured from the initial sampling configuration 1000 of FIG. 10 via the switch circuitry 919 without discharging the capacitors 925 and 926. In this configuration, it will be appreciated that the output voltage of the differential amplifier ($VR_{1+}$-$VR_{1-}$) is $2*(V_{IN+}-V_{IN-})$.

Further, in amplification configuration 1100, the positive output terminal of the differential amplifier 912 drives charge into the capacitors 923 and 924 so that the voltage difference between the first terminals of the capacitors 923 and 924 and their second terminals is equal to $VR_{1+}$, or $2*V_{IN+}$. The negative output terminal of the differential amplifier 912 drives charge into the capacitors 927 and 928 so that the voltage difference between the first terminals of the capacitors 927 and 928 and their second terminals is equal to $VR_{1-}$, or $2*V_{IN-}$. In the event that 2× amplification is sufficient, the analog component 906 is arranged into an RSD conversion configuration and the conversion process can be initiated using the 2× amplified analog signal (as represented by the voltage across the terminals of the capacitors 323 and 324 and capacitors 327 and 328).

Otherwise, additional amplification can be achieved via the amplification configuration 1200 of FIG. 12 for a first phase of a second cycle of the clock signal. In the amplification configuration 1200, the first terminal and the second terminal of the capacitor 923 are connected to voltage reference $V_{AG}$ and the negative input terminal of the differential amplifier 912, respectively. Likewise, the first terminal and the second terminal of the capacitor 927 are connected to the voltage reference $V_{AG}$ and the positive input terminal of the differential amplifier 912, respectively. The first terminal and the second terminal of the capacitor 924 are connected to the positive output terminal and the negative input terminal, respectively, of the differential amplifier 912. The first terminal and the second terminal of the capacitor 928 are connected to the negative output terminal and the positive input terminal, respectively, of the differential amplifier 912. The first terminal of the capacitor 921 and the first terminal of the capacitor 922 are connected to the positive output terminal of the differential amplifier 912 and the second terminal of the capacitor 921 and the second terminal of the capacitor 922 are connected to the voltage reference $V_{AG}$. The first terminal of the capacitor 925 and the first terminal of the capacitor 926 are connected to the negative output terminal of the differential amplifier 912 and the second terminal of the capacitor 925 and the second terminal of the capacitor 926 are connected to the voltage reference $V_{AG}$. Thus, it will be appreciated that, between the amplification configuration 1100 and the amplification configuration 1200, the capacitor 921 and the capacitor 923 switch places, the capacitor 922 and the capacitor 924 switch places, the capacitor 925 and the capacitor 927 switch paces, and the capacitor 926 and the capacitor 928 switch places.

For the amplification configuration 1200, the capacitors 923, 924, 927, and 928 are reconfigured from the amplification configuration 1100 of FIG. 11 via the switch circuitry 919 and the switch circuitry 920 without discharging the capacitors 923, 924, 927, and 928. In this configuration, it will be appreciated that the output voltage ($VR+_2$-$VR_{-2}$) of the differential amplifier 912 is $4*(V_{IN+}-V_{IN-})$ (i.e., $2*2*(V_{IN+}-V_{IN-})$).

Further, the positive output of the differential amplifier 912 drives charge into the capacitors 921 and 922 so that the voltage difference between the first terminals of the capacitors 921 and 922 and their second terminals is equal to $VR+_2$, or $4*V_{IN+}$. The negative output of the differential amplifier 912 drives charge into the capacitors 925 and 926 so that the voltage difference between the first terminals of the capacitors 925 and 926 and their second terminals is equal to $VR-_2$, or 4*$V_{IN-}$. In the event that 4× amplification is sufficient, the conversion process can be initiated using the 4× amplified analog signal. Otherwise, in the event that an amplification greater than 4× (and being a power of two) is needed, a sequence of configurations alternating between the amplification configuration 1100 and the amplification configuration 1200 can be performed until the desired amplification is achieved.

Figure 13:
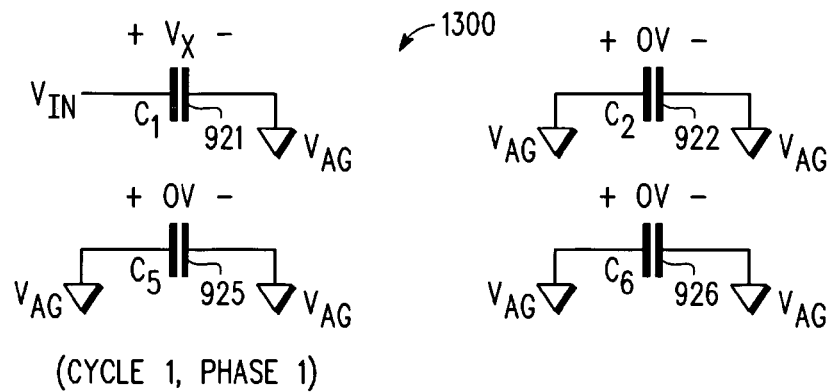
FIG. 13 is a circuit diagram illustrating a fourth capacitor configuration of the differential signaling-based RSD ADC of FIG. 9 for sampling a single-ended input analog signal in accordance with at least one embodiment of the present disclosure.
Figure 14:
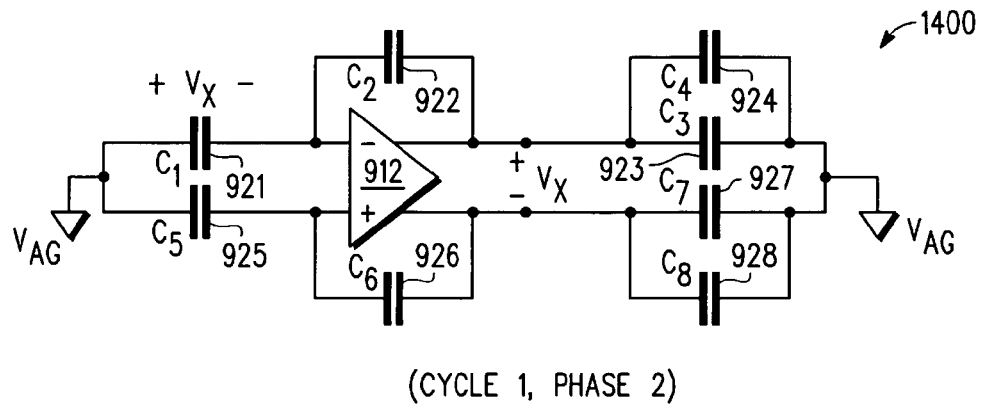
FIG. 14 is a circuit diagram illustrating a fifth capacitor configuration of the differential signaling-based RSD ADC of FIG. 9 for converting the sampled single-ended input analog signal of FIG. 13 to a differential signal without amplification in accordance with at least one embodiment of the present disclosure.
Figure 15:
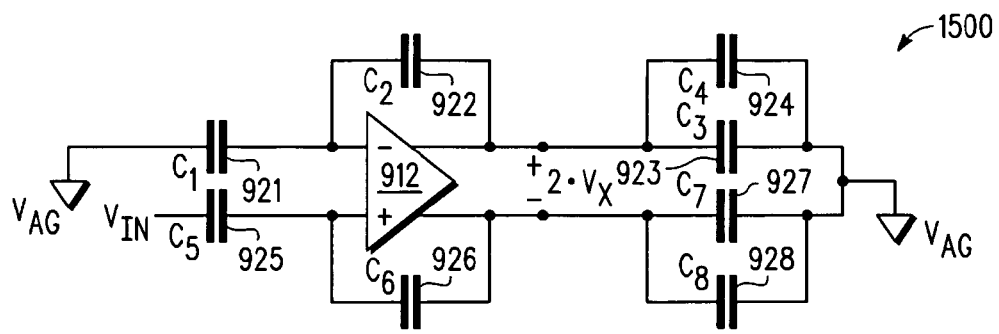
FIG. 15 is a circuit diagram illustrating a sixth capacitor configuration of the differential signaling-based RSD ADC of FIG. 9 for converting the sampled single-ended input analog signal of FIG. 13 to a differential signal with amplification in accordance with at least one embodiment of the present disclosure.

FIGS. 13-15 illustrate example sequences of capacitor configurations for the conversion of a single-ended input signal to a differential signal for digital conversion in accordance with the techniques described herein. The combination of FIGS. 13 and 14 illustrate a sequence of capacitor configurations that converts the single-ended input signal to a differential signal without amplification. The combination of FIGS. 13 and 15 illustrates a sequence of capacitor configurations that converts the single-ended input signal to a differential signal while concurrently achieving a 2× gain in the resulting differential signal. For ease of illustration, the sequence of capacitor configurations is described in the context of the RSD ADC 902 of FIG. 9. The illustrated configurations are achieved via configurations of switches of switch circuitry 920 and switch circuitry 919, but for clarity purposes the switches are omitted from the illustrated configurations of FIGS. 13-15.

FIG. 13 illustrates an initial sampling configuration 1300 of the capacitors 921 and 925 at a first phase of a first cycle of a clock signal. The first terminal of the capacitor 921 is connected to receive the analog voltage $V_{IN}$ of a single-ended input signal and the first terminal of the capacitor 925 is connected to the voltage reference $V_{AG}$. The second terminal of the capacitor 921 and the second terminal of the capacitor 925 are connected to the voltage reference $V_{AG}$. Further, the capacitors 922 and 926 are configured in the same manner as capacitor 925. Accordingly, the initial sampling configuration 1300 results in the voltage $V_X$ across the capacitor 921 (where $V_X=V_{IN}-V_{AG}$) and a voltage of approximately 0 V across the capacitors 922, 925, and 926.

FIG. 14 illustrates a non-amplified single-ended signal to differential signal conversion configuration 1400 of the capacitors 921-928 at a second phase of the first cycle of the clock signal. The first terminal and the second terminal of the capacitor 921 are connected to the voltage reference $V_{AG}$ and the negative input terminal of the differential amplifier 912, respectively. The first terminal and the second terminal of the capacitor 922 are connected to the positive output terminal and the negative input terminal, respectively, of the differential amplifier 912. The first terminal and the second terminal of the capacitor 925 are connected to the voltage reference $V_{AG}$ and the positive input terminal of the differential amplifier 912, respectively. The first terminal and the second terminal of the capacitor 926 are connected to the negative output terminal and the positive input terminal, respectively, of the differential amplifier 912. The first terminal of the capacitor 923 and the first terminal of the capacitor 924 are connected to the positive output terminal of the differential amplifier 912 and the second terminal of the capacitor 923 and the second terminal of the capacitor 924 are connected to the voltage reference $V_{AG}$. The first terminal of the capacitor 927 and the first terminal of the capacitor 928 are connected to the negative output terminal of the differential amplifier 912 and the second terminal of the capacitor 927 and the second terminal of the capacitor 928 are connected to the voltage reference $V_{AG}$.

In this configuration, it will be appreciated that the output voltage of the differential amplifier 912 is $V_X$, thereby converting the single-ended input signal having a voltage $V_{IN}$ to a differential signal having a voltage difference $V_X$ between the signal components. The resulting differential signal then may be sampled by capacitors 923, 924, 927, and 928 and the amplification and digital conversion processed performed as described above.

FIG. 15 illustrates an alternate single-ended to differential conversion configuration 1500 of the capacitors 921-928 at the second phase of the first cycle of the clock signal whereby the resulting differential signal is amplified by a gain of 2× concurrent with the single-ended to differential conversion. The configuration 1500 of FIG. 15 is same as the configuration 1400 of FIG. 14, with the exception that the first terminal of the capacitor 925 is instead connected to receive the voltage $V_{IN}$ of the single-ended input signal (rather than connected to the voltage reference $V_{AG}$ as occurs in the configuration 1400 of FIG. 14). In this configuration, it will be appreciated that the output voltage of the differential amplifier 912 is 2*$V_X$, thereby converting and amplifying the single-ended input signal having a voltage $V_{IN}$ into a differential signal having a voltage difference 2*$V_X$ between the signal components. The resulting differential signal then may be sampled by capacitors 923, 924, 927, and 928 and the amplification and digital conversion processed performed via the sampling capacitors as described above.

Figure 16:
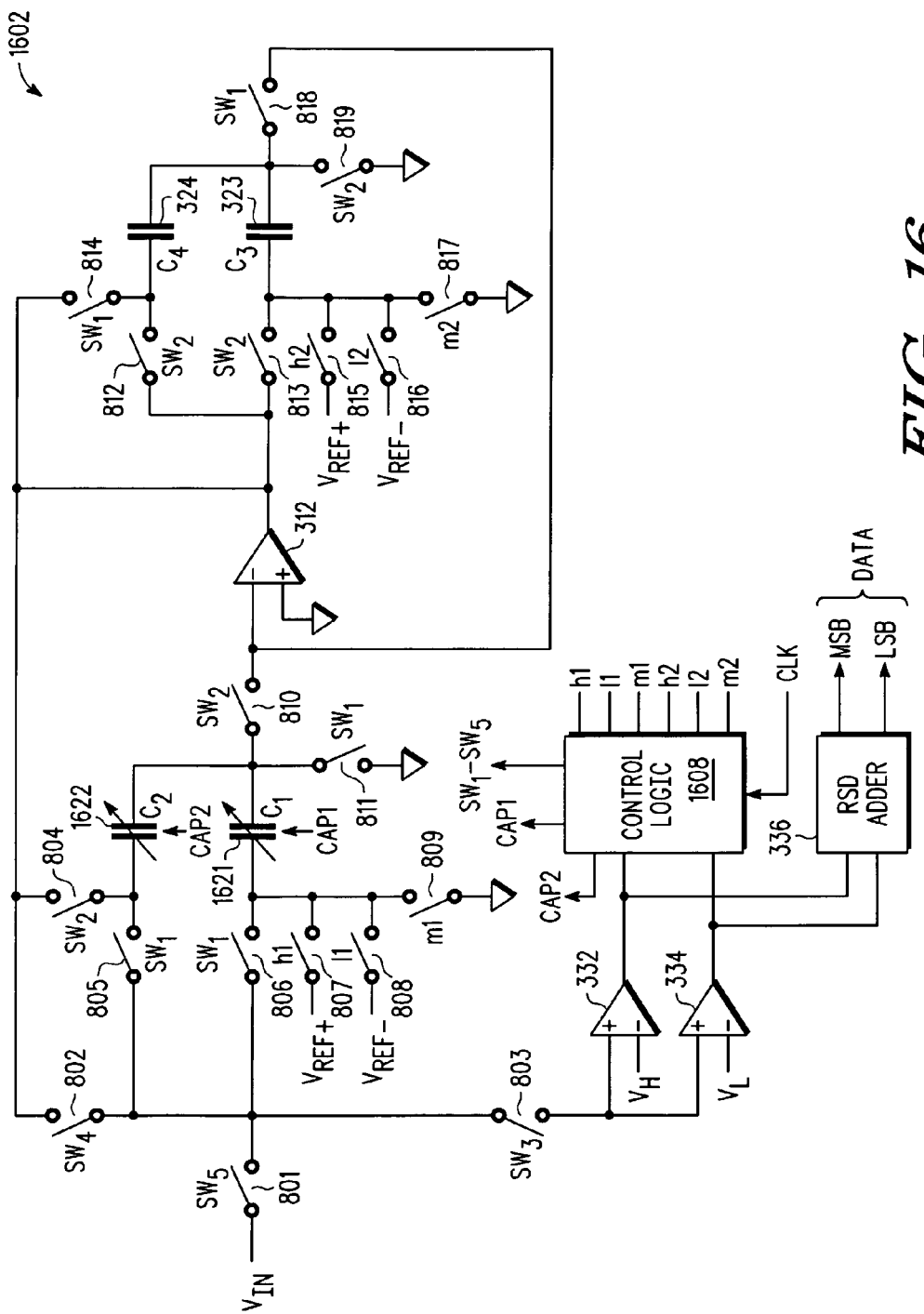
FIG. 16 is a diagram illustrating an example single-ended implementation of the RSD ADC of FIG. 1 that utilizes programmable capacitors in accordance with at least one embodiment of the present disclosure.

FIG. 16 illustrates another example implementation of an RSD ADC in accordance with at least one embodiment of the present disclosure. In the embodiments described above, switch circuitry was used to arrange different capacitor configurations for multiple amplification passes to as to iteratively amplify an input analog signal to a desired voltage level. The RSD ADC 1602 depicted in FIG. 16 is substantially similar to the RSD ADC 302 depicted in FIG. 8, with the exception that programmable capacitors 1621 and 1622 are used in place of the capacitors 1621 and 1622, and that the control logic 1608 is configured to also provide capacitance adjustment signals CAP1 and CAP2 to adjust the capacitances of programmable capacitors 1621 and 1622, respectively. In one embodiment, the programmable capacitors 1621 and 1622 are configured as programmable capacitor networks, and example of which is described in the aforementioned U.S. Pat. No. 5,625,361. Although FIG. 16 depicts a single-ended implementation, the programmable capacitor-based RSD ADC can be implemented as a differential signaling-based implementation as similarly illustrated by FIG. 9.

Figure 17:
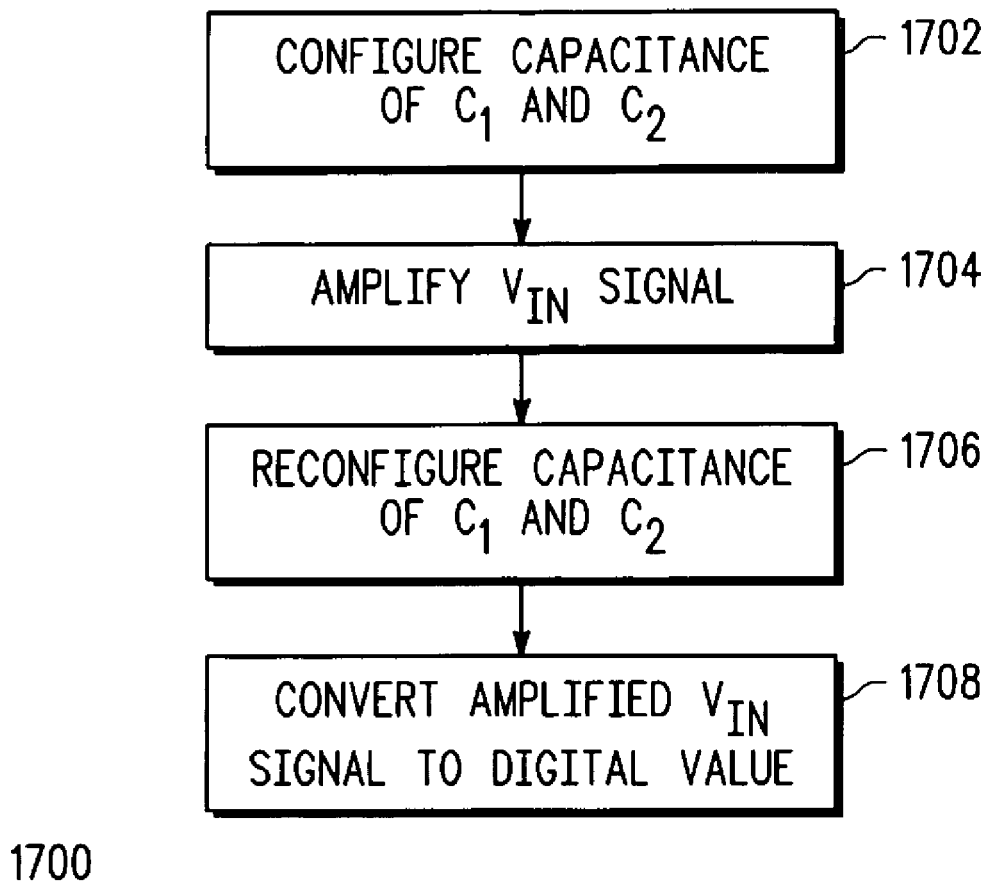
FIG. 17 is a flow diagram illustrating an example operation of the single-ended RSD ADC of FIG. 16 in accordance with at least one embodiment of the present disclosure.

FIG. 17 illustrates an example method 1700 of operation of the RSD ADC 1602 of FIG. 16 in accordance with at least one embodiment of the present disclosure. In at least one embodiment, the method 1700 can be implemented at least in part as a state machine of the control logic 1608.

At block 1702, the control logic 1608 configures the capacitances of the programmable capacitors 1621 and 1622 to provide a desired amplification of the input analog signal once configured in the amplifier configuration with the amplifier 312. Assuming the programmable capacitor 1621 has a programmable capacitance C1 and the programmable capacitor 1622 has a programmable capacitance C2, the output voltage (VR) of the amplifier 312 in this configuration is equal to:

$$VR = \left(1 + \frac{C2}{C1}\right) \times V_{IN}$$

and thus the gain of the amplification configuration of the amplifier 312 and the programmable capacitors 1621 and 1622 is $$\text{Gain} = \left(1 + \frac{C2}{C1}\right)$$

To achieve a particular gain, the control logic 1608 can adjust the capacitances C1 and C2 via the CAP 1 and CAP2 signals so as to achieve the ratio of the capacitance C2 to the capacitance C1 corresponding to the particular gain. For example to achieve a 2× gain, the control logic 308 can program the programmable capacitors 1621 and 1622 at block 1702 to have substantially similar capacitances (i.e., the ratio of capacitance C2 to capacitance C1 is 1:1, resulting in a gain of 2). Likewise, to achieve a gain of 3×, the capacitance C1 of the programmable capacitor 1622 can be set to one-half of the capacitance C2 of the programmable capacitor 1621 (i.e., the ratio of capacitance C2 to capacitance C1 is 2:1, resulting in a gain of 3). Further, to achieve a gain of 4×, the capacitance C1 of the programmable capacitor 1622 can be set to one-third of the capacitance C2 of the programmable capacitor 1621 (i.e., the ratio of capacitance C2 to capacitance C1 is 3:1, resulting in a gain of 4). The desired ratio of capacitances can be achieved by increasing the capacitance C2 while maintaining the capacitance C1 at the capacitance used during the RSD conversion stage, by decreasing the capacitance C1 while maintaining the capacitance C2 at the capacitance used during the RSD conversion stage, or by increasing the capacitance C2 while decreasing the capacitance C1.

After programming the programmable capacitors 1621 and 1622 to the desired capacitances, the programmable capacitors 1621 and 1622 are configured into an initial sampling configuration corresponding to the initial sampling configuration 400 of FIG. 4, and while in this configuration, the input analog signal is applied to the programmable capacitors 1621 and 1622 so as to create a voltage difference across their terminals that is equal to the voltage $V_{IN}$ of the input analog signal.

After sampling the input analog signal using the programmable capacitors 1621 and 1622, at block 1704 the programmable capacitors 1621 and 1622 and the capacitors 1623 and 1624 are configured into an amplifier configuration corresponding to the amplifier configuration 500 of FIG. 5 so as to amplify the input analog signal to generate an amplified analog signal. As discussed above, the resulting gain of the amplified signal will be approximately equal to 1+(C2/C1).

At block 1706, the switches 801-819 are engaged to as to reconfigure the programmable capacitors 1621 and 1622 and the capacitors 1623 and 1624 into a conventional RSD analog stage for conversion of the amplified analog signal to a digital signal. This reconfiguration can include, for example, reprogramming the programmable capacitors 1621 and 1622 to have substantially equal capacitances, thereby configuring the RSD analog stage to have a standard gain of 2× during the conversion process.

The term "another", as used herein, is defined as at least a second or more. The terms "including", "having", or any variation thereof, as used herein, are defined as comprising. The term "coupled", as used herein with reference to electro-optical technology, is defined as connected, although not necessarily directly, and not necessarily mechanically.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. An analog-to-digital converter (ADC) device comprising:
   an input terminal to receive an analog signal;
   an analog component coupled to the input terminal and comprising:
      an amplifier comprising an input and an output; and
      a capacitor network coupled to the input and the output of the amplifier, the capacitor network comprising:
         a first programmable capacitor comprising a first terminal coupleable to the input terminal and coupleable to the output of the amplifier, and a second terminal coupleable to the input of the amplifier and coupleable to a voltage reference; and
         a second programmable capacitor comprising a first terminal coupleable to the input terminal and coupleable to the voltage reference and a second terminal coupleable to the input of the amplifier and coupleable to the voltage reference; and
   control logic configured to:
      in a first mode, configure the capacitor network and the amplifier in an amplification configuration to amplify the analog signal by a predetermined gain to generate an amplified analog signal; and
      in a second mode, configure the capacitor network and the amplifier to generate a series of one or more residue voltages using the amplified analog signal.

2. The ADC of claim 1, wherein the control logic is configured to:
   in the first mode:
      configure the first programmable capacitor to a first capacitance and configure the second programmable capacitor to a second capacitance based on the predetermined gain;
      at a first phase, configure the capacitor network so as to couple the first terminal of the first programmable capacitor and the first terminal of the second programmable capacitor to the input terminal and to couple the second terminal of the first programmable capacitor and the second terminal of the second programmable capacitor to the voltage reference; and
      at a second phase following the first phase, configure the capacitor network so as to couple the first terminal of the first programmable capacitor to the output of the amplifier and couple the second terminal of the first programmable capacitor to the input of the amplifier and to couple the first terminal of the second programmable capacitor to the voltage reference and to couple the second terminal of the second programmable capacitor to the input of the amplifier.

3. The ADC of claim 2, wherein the control logic is configured to:
   in the second mode, configure the first programmable capacitor to a third capacitance and configure the second programmable capacitor to the third capacitance.

4. A method comprising:
   receiving a first analog signal at an input terminal of an analog-to-digital converter (ADC);
   configuring a capacitor network and an amplifier of the ADC to amplify the first analog signal by a first gain to generate a first amplified analog signal;
   configuring the capacitor network and the amplifier to generate a first series of one or more residue voltages based on the first amplified analog signal;

providing for output from the ADC a first digital value based on the first series of one or more residue voltages;

receiving a second analog signal at the input terminal of the ADC;

configuring the capacitor network and the amplifier of the ADC to amplify the second analog signal by a second gain to generate a second amplified analog signal the second gain different than the first gain;

configuring the capacitor network and the amplifier to generate a second series of one or more residue voltages based on the second amplified analog signal; and providing for output from the ADC a second digital value based on the second series of one or more residue voltages.

5. An analog-to-digital converter (ADC) device comprising:

an input terminal to receive an analog signal;

an analog component coupled to the input terminal and comprising:

a an amplifier comprising an input and an output; and a capacitor network coupled to the input and the output of the amplifier, the capacitor network comprising:

a first capacitor comprising a first terminal coupleable to the input terminal and coupleable to a voltage reference, and a second terminal coupleable to the input of the amplifier and coupleable to the voltage reference;

a second capacitor comprising a first terminal coupleable to the input terminal and coupleable to the output of the amplifier, and a second terminal coupleable to the input of the amplifier and coupleable to the voltage reference;

a third capacitor comprising a first terminal coupleable to the output of the amplifier and coupleable to the voltage reference and a second terminal coupleable to the input of the amplifier and coupleable to the voltage reference; and a fourth capacitor comprising a first terminal coupleable to the output of the amplifier and coupleable to the voltage reference and a second terminal coupleable to the input of the amplifier and coupleable to the voltage reference; and control logic configured to:

in a first mode, configure the capacitor network and the amplifier in an amplification configuration to amplify the analog signal by a predetermined gain to generate an amplified analog signal; and in a second mode, configure the capacitor network and the amplifier to generate a series of one or more residue voltages using the amplified analog signal.

6. The ADC of claim 5, further comprising:

digital conversion logic coupled to the analog component, the digital conversion logic configured to generate a digital value based on the series of one or more residue voltages.

7. The ADC of claim 5, wherein the control logic is configured to:

at a first phase of the first mode:

couple the first terminal of the first capacitor and the first terminal of the second capacitor to the input terminal; and couple the second terminal of the first capacitor and the second terminal of the second capacitor to the voltage reference;

at a second phase of the first mode following the first phase:

couple the first terminal of the first capacitor to the voltage reference;

couple the first terminal of the second capacitor to the output of the amplifier; and couple the second terminal of the first capacitor and the second terminal of the second capacitor to the input of the amplifier.

8. The ADC of claim 7, wherein the control logic is configured to:

at the second phase of the first mode:

couple the first terminal of the third capacitor and the first terminal of the fourth capacitor to the output of the amplifier; and couple the second terminal of the third capacitor and the second terminal of the fourth capacitor to the voltage reference; and at a third phase of the first mode following the second phase:

couple the first terminal of the third capacitor to the voltage reference;

couple the first terminal of the fourth capacitor to the output of the amplifier; and couple the second terminal of the third capacitor and the second terminal of the fourth capacitor to the input of the amplifier.

9. An analog-to-digital converter (ADC) device comprising:

a first input terminal to receive a first analog signal;

a second input terminal to receive a second analog signal;

an analog component coupled to the first input terminal and the second input terminal and comprising:

a differential amplifier comprising a first input, a second input, a first input, and a second output; and a first capacitor network coupled to the first input and the first output of the differential amplifier, the first capacitor network comprising a first plurality of capacitors; and a second capacitor network coupled to the second input and the second output of the differential amplifier, the second capacitor network comprising a second plurality of capacitors; and control logic configured to:

in a first mode:

configure the first capacitor network and the differential amplifier in an amplification configuration to amplify the first analog signal by a predetermined gain to generate a first amplified analog signal; and configure the second capacitor network and the differential amplifier in an amplification configuration to amplify the second analog signal by the predetermined gain to generate a second amplified analog signal; and in a second mode:

configure the first capacitor network and the differential amplifier to generate a first series of one or more residue voltages using the first amplified analog signal; and configure the second capacitor network and the differential amplifier to generate a second series of one or more residue voltages using the second amplified analog signal.

10. The ADC of claim 9, wherein the first analog signal comprises a first signal component of a differential signal and the second analog signal comprises a second signal component of the differential signal.

11. The ADC of claim 9, wherein the first analog signal comprises a single-ended analog signal and the second analog signal comprises a voltage reference.

12. A method comprising:
receiving an analog signal at an input terminal of an analog-to-digital converter (ADC);
configuring a capacitor network and an amplifier of the ADC to amplify the analog signal by a predetermined gain to generate an amplified analog signal, wherein configuring the capacitor network and the amplifier comprises:
configuring a first programmable capacitor of the capacitor network to have a first capacitance and configuring a second programmable capacitor of the capacitor network to have a second capacitance based on the select gain;
at a first phase:
coupling a first terminal of the first programmable capacitor and a first terminal of the second programmable capacitor to the input terminal; and
coupling a second terminal of the first programmable capacitor and a second terminal of the second programmable capacitor to a voltage reference; and
at a second phase following the first phase:
coupling the first terminal of the first programmable capacitor and the second terminal of the second programmable capacitor to an input of the amplifier;
coupling the second terminal of the first programmable capacitor to the voltage reference; and
coupling the first terminal of the second programmable capacitor to an output of the amplifier; and
configuring the capacitor network and the amplifier to generate a series of one or more residue voltages based on the amplified analog signal; and
providing for output from the ADC a digital value based on the series of one or more residue voltages.

13. The method of claim 12, wherein configuring the capacitor network and the amplifier to generate a series of one or more residue voltages based on the amplified analog signal comprises configuring the first programmable capacitor and the second programmable capacitor to each have a third capacitance.

14. A method comprising:
receiving an analog signal at an input terminal of an analog-to-digital converter (ADC);
configuring a capacitor network and an amplifier of the ADC to amplify the analog signal by a predetermined gain to generate an amplified analog signal, wherein configuring the capacitor network and the amplifier comprises:
at a first phase of the first mode:
coupling a first terminal of a first capacitor of the capacitor network and a first terminal of a second capacitor of the capacitor network to the first input terminal; and
coupling a second terminal of the first capacitor and a second terminal of the second capacitor to a voltage reference;
at a second phase of the first mode following the first phase:
coupling the first terminal of the first capacitor to the voltage reference;
coupling the first terminal of the second capacitor to an output of the amplifier; and
coupling the second terminal of the first capacitor and the second terminal of the second capacitor to an input of the amplifier; and
configuring the capacitor network and the amplifier to generate a series of one or more residue voltages based on the amplified analog signal; and
providing for output from the ADC a digital value based on the series of one or more residue voltages.

15. The method of claim 14, wherein configuring the capacitor network and the amplifier to amplify the analog signal further comprises:
at the second phase of the first mode:
coupling a first terminal of a third capacitor of the capacitor network and a first terminal of a fourth capacitor of the capacitor network to the output of the amplifier; and
coupling a second terminal of the third capacitor and a second terminal of the fourth capacitor to the voltage reference; and
at a third phase of the first mode following the second phase:
coupling the first terminal of the third capacitor to the voltage reference;
coupling the first terminal of the fourth capacitor to the output of the amplifier; and
coupling the second terminal of the third capacitor and the second terminal of the fourth capacitor to the input of the amplifier.

16. A method comprising:
receiving a first analog signal at a first input terminal of an analog-to-digital converter (ADC);
receiving a second analog signal at a second input terminal of the ADC;
configuring a first capacitor network and an amplifier of the ADC to amplify the first analog signal by a predetermined gain to generate a first amplified analog signal;
configuring a second capacitor network and the amplifier of the ADC to amplify the second analog signal by the predetermined gain to generate a second amplified analog signal;
configuring the first capacitor network and the amplifier to generate a first series of one or more residue voltages based on the first amplified analog signal;
configuring the second capacitor network and the amplifier to generate a second series of one or more residue voltages based on the second amplified analog signal;
providing for output from the ADC a digital value based on the first series of one or more residue voltages and the second series of one or more residue voltages.

17. The method of claim 16, wherein the first analog signal comprises a first signal component of a differential signal and the second analog signal comprises a second signal component of the differential signal.

18. The method of claim 16, wherein the first analog signal comprises a single-ended analog signal and the second analog signal comprises a voltage reference.

* * * * *

UNITED STATES PATENT AND TRADEMARK OFFICE
CERTIFICATE OF CORRECTION

PATENT NO.       : 7,589,658 B2                                                   Page 1 of 1
APPLICATION NO.  : 12/026205
DATED            : September 15, 2009
INVENTOR(S)      : Juxiang Ren et al.

It is certified that error appears in the above-identified patent and that said Letters Patent is hereby corrected as shown below:

Column 20, Line 30, please change "a first input, a second input, a first input, and a second output; and" to --a first input, a second input, a first output, and a second output; and--

Signed and Sealed this
Twenty-fifth Day of October, 2011

David J. Kappos
*Director of the United States Patent and Trademark Office*